United States Patent [19]

Poliniak et al.

[11] 4,126,712

[45] Nov. 21, 1978

[54] METHOD OF TRANSFERRING A SURFACE RELIEF PATTERN FROM A WET POLY(OLEFIN SULFONE) LAYER TO A METAL LAYER

[75] Inventors: Eugene S. Poliniak, Willingboro; Nitin V. Desai, Edison, both of N.J.

[73] Assignee: RCA Corporation, New York, N.Y.

[21] Appl. No.: 710,134

[22] Filed: Jul. 30, 1976

[51] Int. Cl.[2] ............................................. B05D 3/06
[52] U.S. Cl. ...................................... 427/41; 96/35.1;
96/36.2; 96/115 R; 204/192 E; 427/43
[58] Field of Search ........ 204/192 E, 192 EC, 159.22;
427/38, 39, 41, 43; 96/35.1, 36.2, 115 R;
156/643, 646

[56] References Cited
U.S. PATENT DOCUMENTS

| | | | |
|---|---|---|---|
| 3,615,956 | 10/1971 | Irving et al. | 427/41 |
| 3,884,696 | 5/1975 | Bowden et al. | 427/43 |
| 3,893,127 | 7/1975 | Kaplan et al. | 427/43 |
| 3,935,332 | 1/1976 | Poliniak et al. | 427/43 |
| 3,964,909 | 6/1976 | Himics et al. | 96/36.2 |

OTHER PUBLICATIONS

Vossen et al., "J. Vac. Sci. Tech.", vol. 12, No. 5, Sep.-/Oct. 1975, pp. 1052-1057.

Primary Examiner—John H. Newsome
Attorney, Agent, or Firm—H. Christoffersen; Birgit E. Morris

[57] ABSTRACT

This invention pertains to a method for forming a surface relief pattern in a metal layer which comprises forming a wet poly(olefin sulfone) layer on the metal layer, forming a surface relief pattern in the wet poly(olefin sulfone) layer, and sputter etching the surface relief pattern from the wet poly(olefin sulfone) layer into the metal layer.

6 Claims, 17 Drawing Figures

METHOD OF TRANSFERRING A SURFACE RELIEF PATTERN FROM A WET POLY(OLEFIN SULFONE) LAYER TO A METAL LAYER

CROSS REFERENCES TO RELATED APPLICATIONS

This application is related to copending application Ser. No. 710184 entitled "Method of Transferring a Surface Relief Pattern from a Poly(olefin sulfone) Layer to a Metal Layer" by E. S. Poliniak, N. V. Desai, and R. J. Himics now U.S. Pat. No. 4,045,318; copending application Ser. No. 710135 entitled "Method for Forming a Shallow Surface Relief Pattern in a Poly(olefin sulfone) Layer" by E. S. Poliniak and N. V. Desai, and copending application Ser. No. 710133 entitled "Method for Forming a Surface Relief Pattern in a Poly(olefin sulfone) Layer" by E. S. Poliniak and N. V. Desai, which applications are concurrently filed and herein incorporated by reference.

BACKGROUND OF THE INVENTION

Forming surface relief patterns in poly(olefin sulfone) polymers by electron beam resist methods are well known and are utilized for a variety of applications. For example, poly(1-methyl-1-cyclopentene sulfone) has been used for audio/video recording applications and is more fully described in U.S. Pat. No. 3,935,331 and 3,935,332 by Poliniak et al.; poly(1-butene sulfone) has been employed for integrated circuit mask formation; and poly(cyclopentene sulfone) and poly(bicycloheptene sulfone) for multilayer integrated circuit mask formation.

Surface relief patterns in the poly(olefin sulfone) layers are formed by dissolving a poly(olefin sulfone) in a solvent, forming a wet layer of the poly(olefin sulfone) solution on a substrate such as metal, baking or vacuum drying the wet layer to remove the solvent, exposing the dry layer to a modulated beam of electrons, and developing the poly(olefin sulfone) layer with a solvent to yield the surface relief pattern. In general the surface relief patterns that are formed in the poly(olefin sulfone) have not been found transferable to a metal substrate by use of sputter etching or ion milling operations wherein material is eroded from the relief pattern surface by ion bombardment. This is a disadvantage in many applications such as audio/video recording where a surface relief pattern which is recorded on a polymeric material must be subsequently transferred onto a metal surface so that the metal surface may be employed as a master for stamping the surface relief pattern in large quantities of vinyl discs. In the past poly(olefin sulfones) that could undergo a sputter etching cycle were limited to the poly(olefin sulfones) that undergo a weight loss at a temperature above about 300° C. as determined by thermogravimetric analysis, hereinafter referred to as TGA temperatures. High TGA temperatures were necessary to survive the high temperatures attained during sputter etching. Other more sensitive poly(olefin sulfones) that had low TGA temperatures and could not survive these high temperatures were automatically eliminated from being used in sputter etching operations.

The sputter etching of one particular poly(olefin sulfone), poly(styrene sulfone), has been described by M. J. Bowden and L. G. Thompson, *Journal of the Electrochemical Society*, 121 1620 (1974). This is a relatively insensitive poly(olefin sulfone), however, and it does not form surface relief patterns with sharp edge definition. Transferring surface relief patterns formed in the more sensitive poly(olefin sulfones) by sputter etching has been desired.

SUMMARY OF THE INVENTION

This invention pertains to a method for forming a surface relief pattern in a metal layer which comprises dissolving a poly(olefin sulfone) in a solvent, applying the resultant solution to a metal layer to form a wet poly(olefin sulfone) layer, exposing the wet layer to a modulated beam of electrons, developing the exposed wet layer to form a surface relief pattern, and bombarding the surface relief pattern with sufficient ions to substantially remove the developed wet layer and etch the surface relief pattern into the metal layer. It has been found that utilizing a wet layer of poly(olefin sulfone) during formation of the surface relief pattern and transfer to the metal layer by ion bombardment allows the use of poly(olefin sulfones) having TGA's well below 300° C., and, hence, the utilization of the more sensitive and sharp edge relief forming poly(olefin sulfones) for sputter etching transfers.

BRIEF DESCRIPTIONS OF THE DRAWINGS

FIGS. 6, 8, 10, 12, 14, and 16 are photomicrographs of sputter etched metal layers of the invention.

FIGS. 7, 9, 11, 13, 15, and 17 are photomicrographs of sputter etched control metal layers.

DETAILED DESCRIPTION OF THE INVENTION

Poly(olefin sulfone) polymers useful for electron beam formation of surface relief patterns are copolymers of olefinically unsaturated hydrocarbons and $SO_2$. These polymers are known and are characterized by an $-SO_2-C-$ linkage. Suitable poly(olefin sulfone) polymers and their accompanying TGA's are as follows: poly(1-methyl-1-cyclopropene sulfone), 325° C.; poly(3-cyclopentyl-1-cyclopentene sulfone), 220° C.; poly(1-cyclopentene sulfone), 200° C.; poly(3-methyl-1-cyclopentene sulfone), 150° C.; poly(3-ethyl-1-cyclopentene sulfone), 150° C.; poly(1-butene sulfone), 120° C.; and poly(5-hexene-2-one sulfone), 110° C. Poly(3-methyl-1-cyclopentene sulfone) and poly(3-ethyl-1-cyclopentene sulfone) are preferred polymers. The molecular weights of these polymers are generally from about 3,000 to about 3,000,000. The poly(olefin sulfones) are prepared as described in U.S. Pat. No. 3,893,127 by Kaplan et al., herein incorporated by reference, and dissolved in a suitable solvent such as methyl ethyl ketone, chloroform, ethylacetate and the like. The poly(olefin sulfone) solution is then formed into a wet layer on a metal layer by well known techniques as spinning, brushing, dipping, and the like. The wet layer will retain solvent found in the layer but will not retain free solvent. Hence, the wet layer will be a firm wet layer. Suitable wet layer thicknesses are from about 0.3 to about 1.0 micron and suitable metal substrates are gold, copper, aluminum, nickel and the like. The metal layer may be a thin metal film from about 200 to 10,000 angstroms, preferably from about 1,000 to 4,000 angstroms, thick which is formed on a substrate by such standard techniques as vapor deposition, chemical plating, and the like. The substrate must provide good adhesion to the metal layer and can be of such standard materials as glass, polyester, another metal and the like. In order to provide good adhesion between the metal layer and the substrate, a metal such as chromium may be interposed. Surface relief patterns are formed on the wet poly(olefin sulfone) polymer layer by exposing the layer to a modulated beam of electrons and developing the layer with a developer solvent. Although the exact mechanism of recording is not known, it is believed the electron beam degrades the $-SO_2-C-$ linkage. This changes the solubility characteristics of the polymer so that, for positive-acting polymers, contact with the solvent dissolves the exposed portions of the film more rapidly than the unexposed portions. Additional details for preparing poly(olefin sulfone) layers and recording surface relief patterns thereon are described more fully in U.S. Pat. No. 3,935,331 and 3,935,332 by Poliniak et al, which are herein incorporated by reference.

Figure 1:
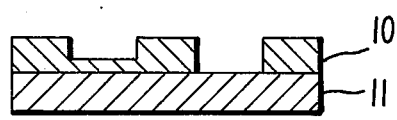
FIG. 1 is a cross sectional view of a developed poly(olefin sulfone) layer on a metal layer.
Figure 2:
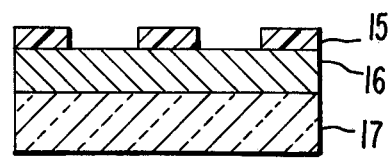
FIG. 2 is a cross sectional view of a developed poly(olefin sulfone) layer, a metal layer, and a substrate.
Figure 3:
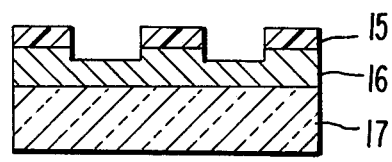
FIG. 3 is a cross sectional view of a developed poly(olefin sulfone) layer, a metal layer, and a substrate.
Figure 4:
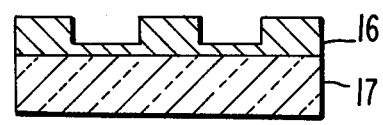
FIG. 4 is a cross sectional view of a sputter etched metal layer on a substrate.

FIG. 1 is a cross section illustration of a surface relief pattern formed in a wet poly(olefin sulfone) layer 10 which is adhered to the surface of a metal layer 11. The surface relief pattern in the wet poly(olefin sulfone) layer 10 may be developed either part way or completely through to the surface of the metal layer 11. In another embodiment of this invention shown in FIG. 2, a surface relief pattern is formed on a wet poly(olefin sulfone) layer 15 which is adhered to a surface of a thin metal layer 16 which in turn is adhered to a substrate 17. After formation of the surface relief pattern on the wet poly(olefin sulfone) layer 15, the surface relief pattern is bombarded with ions which causes the removal of material from the bombarded surface. As shown in FIG. 2, the surface relief pattern on the wet poly(olefin sulfone) layer 15 exposes certain portions and covers other portions of the metal layer 16. During ion bombardment, both the exposed metal layer 16 and the polymer layer 15 are eroded simultaneously. As shown in FIG. 3, a surface relief pattern forms in the metal layer 16 which corresponds to the surface relief pattern of the layer 15. The bombardment is continued until the surface relief pattern formed in the metal layer 16 has approximately the same depth as the initial surface relief pattern in the wet poly(olefin sulfone) layer 15. After bombardment has been completed, any residual polymer is removed by standard techniques such as reactive sputter cleaning or chemical stripping with organic solvents or strong oxidizing agents such as Caro's acid or chromate sulfuric acid and the like. FIG. 4 shows the surface relief pattern transferred to the metal layer 16.

Figure 5:
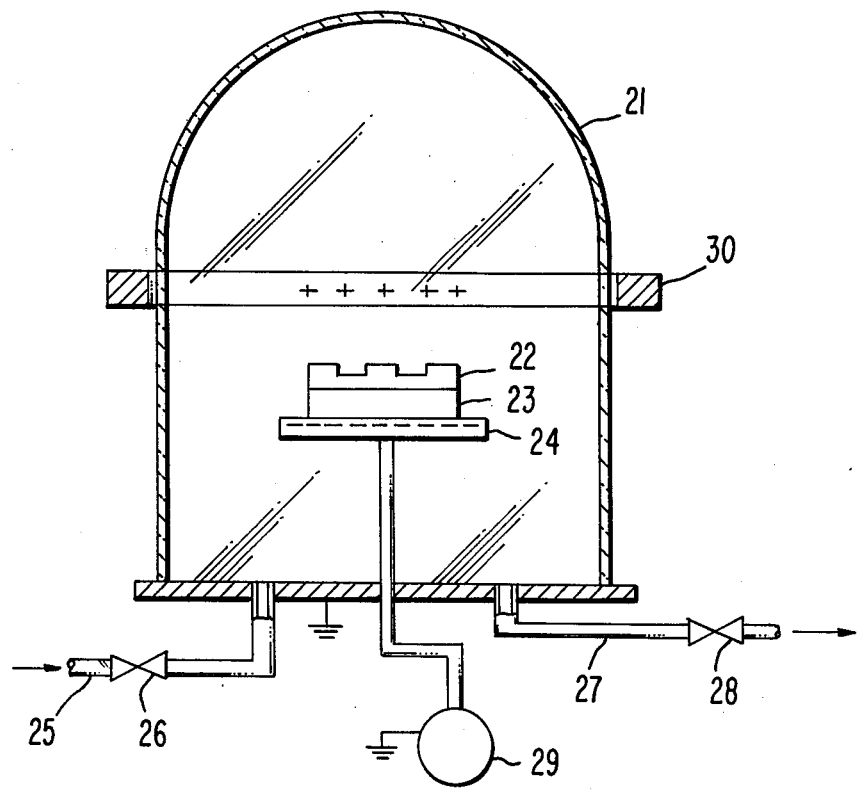
FIG. 5 is a schematic view of an ion bombarding apparatus.
Figure 6:
Figure 7:
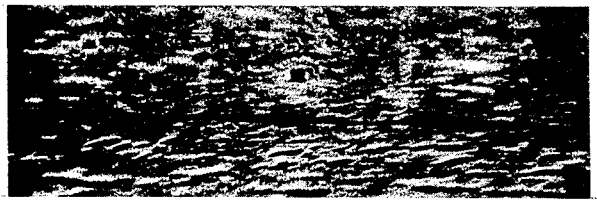
Figure 8:
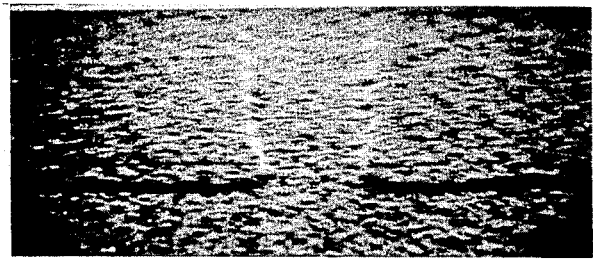
Figure 9:
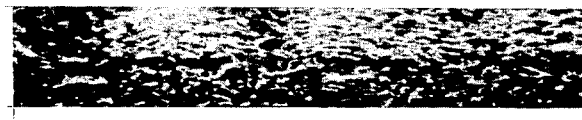
Figure 10:
Figure 11:
Figure 12:
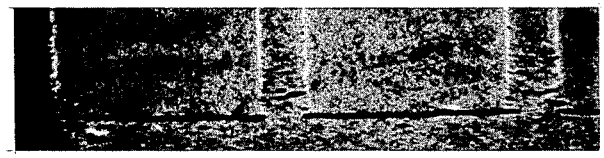
Figure 13:
Figure 14:
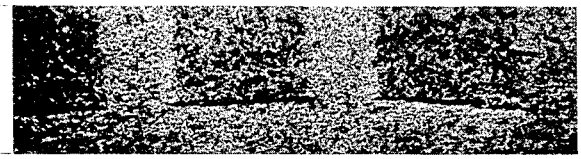
Figure 15:
Figure 16:
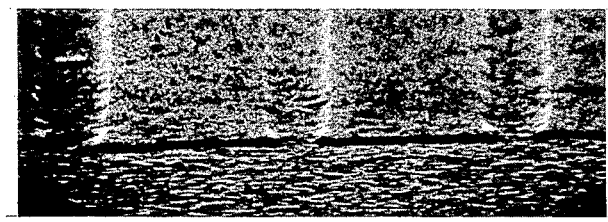
Figure 17:
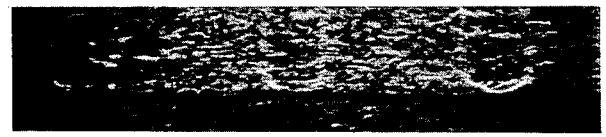

A schematic diagram of an apparatus for sputter etching by ion bombardment is shown in FIG. 5. In a housing 21 is placed a poly(olefin sulfone) layer 22 and a metal layer 23 on a metal plate 24. A continuous flow of low pressure inert gas is maintained in the housing 21 which is introduced through a line 25 and a valve 26 and withdrawn through a line 27 and a valve 28. On the metal plate 24 is created a negative potential by means of a D.C. biased radio frequency generator 29 grounded to the apparatus. The negative potential on the plate 24 is maintained at sufficient magnitude to create a glow discharge primarily of positive ions in the inert gas above the plate 24. To steady the glow discharge, a magnetic field above the plate 24 is imposed by means of a magnetic coil 30. The positive ions in the glow discharge are forced by the negative potential of the plate 24 to spiral towards the plate 24 and strike the poly(olefin sulfone) layer 22 and the metal layer 23. This causes erosion of the struck surface. The erosion is continued until the poly(olefin sulfone) layer 22 is substantially removed and until sufficient penetration of the surface relief pattern into the metal layer 23 has occurred. The glow discharge is then terminated and the metal layer 23 is removed from the housing 21.

The invention will be further illustrated by the following examples but it is to be understood that the invention is not meant to be limited to the details described therein.

EXAMPLES 1-6

Poly(1-methyl-1-cyclopropene sulfone), (EXAMPLE 1); poly(1-cyclopentene sulfone), (EXAMPLE 2); poly(3-methyl-1-cyclopentene sulfone), (EXAMPLE 3); poly(3-ethyl-1-cyclopentene sulfone), (EXAMPLE 4); poly(butene sulfone), (EXAMPLE 5); and poly(5-hexene-2-one sulfone), (EXAMPLE 6); were each prepared by adding about 0.1 mole of the corresponding olefin monomer to about 25–30 ml of cold liquified $SO_2$ at about $-75°$ C., adding 0.2 ml of t-butylhydroperoxide and reacting for about 6 hours. The poly(olefin sulfones) were purified by precipitation from methanol. The purified polymers were then dissolved in a solvent to make a 2–6 percent by weight solution. Several glass plates (1.3 cm by 1.3 cm) were coated with a 2,000 angstroms thick layer of gold over a 20 angstroms thick layer of chromium in contact with the glass plate. Each poly(olefin sulfone) solution was formed into a 1.0 micron thick layer on the gold surface of a separate plate. The spun samples were covered and allowed to set for 24 hours at room temperature in order to relieve any strain in the polymer layer.

Utilizing an electron scanning microscope with a 10 kilovolt, 3 nanoampere source, the wet layers were exposed to a modulated Gaussian shaped beam with a diameter of about 0.21 micron. The polymer layers were exposed to the electron beam using a scan speed of 2.5 cm per second except for the poly(3-methyl-1-cyclopentene sulfone) layer wherein the scan speed was 10 cm/sec. The layers were developed by contacting a suitable solvent such as a 50% by weight 2-methylcyclohexanone - 50% by weight 2-methylcyclohexanol which formed surface relief patterns in the polymer layers, rinsing with Freon TF, and then spun drying.

Next, employing an apparatus as described in FIG. 5, the surface relief patterns were sputter etched into the metal layers under the following conditions:

| | |
|---|---|
| Pressure of Argon | 2.5 microns |
| Magnetic field coil | 20 gauss |
| R.F. Sheath potential | 600 volts |
| Time of etching | 5 minutes |

The residual polymer layers were removed using a chromate/sulfuric acid solution. FIGS. 6, 8, 10, 12, 14, and 16 are photomicrographs of the sputter etched metals of EXAMPLES 1, 2, 3, 4, 5, and 6, respectively, illustrating the excellent quality of the transferred surface relief pattern.

EXAMPLES 7-12

As controls, EXAMPLES 7-12 essentially repeated EXAMPLES 1-6 except that the poly(olefin sulfone) layers were vacuum dried at a temperature of 22° C. for 18 hours prior to the electron beam exposure and the surface relief pattern in the poly(3-methyl-1-cyclopentene sulfone) layer was formed using 2.5 cm/sec. scan speed. FIGS. 7, 9, 11, 13, 15, and 17 are photomicrographs of surface relief patterns formed in metal layers of EXAMPLES 7, 8, 9, 10, 11, and 12, respectively, illustrating the distorted and pitted surface relief patterns which were transferred to the metal layers.

We claim:

1. A method for forming a surface relief pattern in a metal layer which comprises:
   a. dissolving a poly(olefin sulfone) in a solvent;
   b. applying the resultant solution to a metal layer to form a wet poly(olefin sulfone) layer on the metal layer;
   c. exposing the wet poly(olefin sulfone) layer to a modulated beam of electrons;
   d. developing the exposed wet poly(olefin sulfone) layer to form a surface relief pattern; and
   e. bombarding the developed surface with sufficient ions to substantially remove the wet poly(olefin sulfone) layer and form the surface relief pattern in the metal layer.

2. A method according to claim 1 wherein the poly(olefin sulfone) is selected from the group consisting of poly(3-methyl-1-cyclopentene sulfone) and poly(3-ethyl-1-cyclopentene sulfone).

3. A method according to claim 1 wherein the wet polymer layer is from about 0.3 to 1.0 micron thick.

4. A method according to claim 1 wherein the metal layer is selected from the group consisting of gold, copper, aluminum, and nickel.

5. A method according to claim 1 wherein the metal layer is formed on a substrate.

6. A method according to claim 5 wherein the metal layer is from about 1,000 to 4,000 angstroms thick.

* * * * *